United States Patent
Rakowski et al.

(10) Patent No.: US 12,222,589 B2
(45) Date of Patent: Feb. 11, 2025

(54) THERMAL STABILIZATION CIRCUIT FOR AN OPTICAL RING RESONATOR

(71) Applicant: GlobalFoundries U.S. Inc., Malta, NY (US)

(72) Inventors: Michal Rakowski, Ballston Spa, NY (US); Vaibhav A. Ruparelia, Bangalore (IN); Riddhi Nandi, Bangalore (IN); Prateek K. Sharma, Uttar Pradesh (IN); Avijit Chatterjee, West Bengal (IN); Vasudeva Reddy KuppiReddy, Bangalore (IN); Indranil Som, West Bengal (IN)

(73) Assignee: GlobalFoundries U.S. Inc., Malta, NY (US)

( * ) Notice: Subject to any disclaimer, the term of this patent is extended or adjusted under 35 U.S.C. 154(b) by 386 days.

(21) Appl. No.: 17/729,031

(22) Filed: Apr. 26, 2022

(65) Prior Publication Data
US 2023/0341627 A1    Oct. 26, 2023

(51) Int. Cl.
*G02B 6/293* (2006.01)
*G02B 6/12* (2006.01)
(Continued)

(52) U.S. Cl.
CPC ....... G02F 1/0123 (2013.01); G02B 6/12026 (2013.01); G02B 6/2934 (2013.01);
(Continued)

(58) Field of Classification Search
CPC . G02B 6/12026; G02B 6/2934; G02F 1/0123; G02F 1/0147; G02F 2201/58; G02F 2203/15; H01S 3/083
See application file for complete search history.

(56) References Cited

U.S. PATENT DOCUMENTS 9,348,154 B2 *  5/2016  Hayakawa ............. G02F 1/225
9,831,360 B2 * 11/2017  Knights ............ H01L 31/02327
(Continued)

FOREIGN PATENT DOCUMENTS

CA       3015200 A1 *  2/2020 ............... G02B 6/12
KR   20090071432 A  *  7/2009 ............. H04B 10/02

OTHER PUBLICATIONS

English Translation of KR 2009-0071432 A, 6 pages. (Year: 2009).*

(Continued)

*Primary Examiner* — Daniel Petkovsek
(74) *Attorney, Agent, or Firm* — David Cain; Hoffman Warnick LLC

(57) ABSTRACT

Disclosed is a thermal stabilization circuit including a heater, which is adjacent and thermally coupled to a closed-curve waveguide of an optical ring resonator, and an analog feedback circuit, which includes a fully autonomous analog feedback loop from a drop port of a bus waveguide of the optical ring resonator to the heater. This analog feedback circuit is configured to dynamically control the electrical power provided to the heater and, thereby to dynamically control the thermal output of the heater in order to tune the ring resonance wavelength to the operating laser wavelength. The analog feedback circuit is further configured to be independent of input power, to be power efficient, to have a relatively small footprint, to have a tunable time constant and to facilitate adjustable wavelength locking. Also disclosed is a device (e.g., a ring-based transceiver or the like), which includes multiple optical ring resonators and corresponding thermal stabilization circuits.

13 Claims, 7 Drawing Sheets

(51) Int. Cl.
 *G02F 1/01* (2006.01)
 *H01S 3/083* (2006.01)
(52) U.S. Cl.
 CPC ........ *G02F 1/0147* (2013.01); *G02F 2201/58* (2013.01); *G02F 2203/15* (2013.01); *H01S 3/083* (2013.01)

(56) References Cited

U.S. PATENT DOCUMENTS

| | | | | |
|---|---|---|---|---|
| 10,409,135 | B2* | 9/2019 | Zid | G02F 1/0147 |
| 10,432,315 | B2* | 10/2019 | Chen | H04B 10/801 |
| 10,651,933 | B1* | 5/2020 | Chiang | H04B 10/0795 |
| 11,139,907 | B2* | 10/2021 | Melikyan | H04B 10/506 |
| 12,009,912 | B2* | 6/2024 | Lin | H04B 10/505 |
| 2014/0321848 | A1* | 10/2014 | Sekiguchi | G02F 1/0123 398/38 |
| 2015/0277053 | A1* | 10/2015 | Zheng | H04J 14/00 385/31 |
| 2017/0010485 | A1* | 1/2017 | Amberg | G02F 1/0121 |

OTHER PUBLICATIONS

Agarwal et al., "Highly Integrated Wavelength-Locked Si Photonic Ring Transmitter using Direct Monitoring of Drop-Port OMA," IEEE, 2017, pp. 111-114.

Li et al., "A 25 Gb/s, 4.4 V-Swing, AC-Coupled Ring Modulator-Based WDM Transmitter with Wavelength Stabolization in 65 nm CMOS," IEEE Journal of Solid-State Circuits, vol. 50, No. 12, 2015, pp. 3145-3159.

Padmaraju et al., "Integrated Thermal Stabilization of a Microring Modulator," OSA, vol. 21, No. 12, 2013, pp. 1-9.

Sun et al., "A 45 nm CMOS-SOI Monolithic Photonics Platform With Bit-Statistics-Based Resonant Microring Thermal Tuning," IEEE Journal of Solid-State Circuits, vol. 51, No. 4, 2016, pp. 893-907.

Boeck, Robert, "Silicon Ring Resonator Add-Drop Multiplexers," The University of British Columbia, 2011, pp. 1-108.

Bogaerts et al., "Silicon Microring Resonators," Laser & Photonics Reviews, vol. 6, No. 1, 2012, pp. 47-73.

\* cited by examiner

THERMAL STABILIZATION CIRCUIT FOR AN OPTICAL RING RESONATOR

BACKGROUND

Field of the Invention

The present invention relates to optical devices and, particularly, to a thermal stabilization circuit for an optical ring resonator.

Description of Related Art

Optical ring resonators are often employed as filters or modulators. However, depending upon the materials used to form optical ring resonators and specifically due to the intrinsic properties of those materials, optical ring resonators can be thermally sensitive. That is, they can exhibit temperature-dependent resonance shifts (TDRS). When this is the case, thermal stabilization circuits including heaters are typically employed for temperature adjustment and thereby for control of the location of the resonance wavelength. Unfortunately, such thermal stabilization circuits are often digital, complex, and consume significant chip area.

SUMMARY

Disclosed herein are embodiments of a circuit structure and, particularly, a thermal stabilization circuit. The structure can include a heater adjacent to an optical ring resonator. The structure can also include an analog feedback circuit. This analog feedback circuit can be configured to detect an optical signal at a drop port of the optical ring resonator, to generate a reference voltage signal using the optical signal, and to control power provided to a heater based on the optical signal and on the reference voltage signal.

More particularly, some embodiments of a circuit structure and, particularly, a thermal stabilization circuit disclosed herein can include a heater adjacent to an optical ring resonator and an analog feedback circuit connected between the optical ring resonator and the heater. Specifically, the analog feedback circuit can include a photosensor, which can be configured to receive an optical signal from a drop port of the optical ring resonator and to output an analog current signal. The analog feedback circuit can further include a current-to-voltage converter, which can be configured to receive the analog current signal and to output an analog voltage signal. The analog feedback circuit can further include a peak-based reference voltage generator, which can be configured to receive the analog voltage signal and to generate a reference voltage signal based the analog voltage signal. The analog feedback circuit can further include a comparator, which can be configured to receive the analog voltage signal and the reference voltage signal and to output a voltage control signal. The analog feedback circuit can further include an integrator, which can be configured to receive the voltage control signal and to output an adjusted voltage signal that is proportional to a time integral of the voltage control signal. The analog feedback circuit can further include a current mirror, which can be configured to receive the adjusted voltage signal and to control power provided to the heater based on the adjusted voltage signal.

Also disclosed herein are embodiments of a device structure that incorporates multiple optical ring resonators and corresponding thermal stabilizations circuits, as described above. That is, a device structure disclosed herein can include multiple optical ring resonators and thermal stabilization circuits for the optical ring resonators. Each thermal stabilization circuit for each optical ring resonator can include a heater adjacent to the optical ring resonator and an analog feedback circuit, which can be configured to detect an optical signal at a drop port of the optical ring resonator, to generate a reference voltage signal using the optical signal, and to control power provided to the heater based on the optical signal and on the reference voltage signal.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, an optical ring resonator can exhibit a TDRS, depending upon the materials used to form the optical ring resonator and specifically due to the intrinsic properties of those materials. For example, an optical ring resonator including silicon waveguide core material and silicon dioxide waveguide cladding material can exhibit TDRSs of approximately 70 picometers per Kelvin (pm/K) or more. When this is the case, thermal stabilization circuits including heaters are typically employed for temperature adjustment and thereby for control of the location of the resonance wavelength. Unfortunately, such thermal stabilization circuits are often digital, complex, and consume significant chip area.

In view of the foregoing, disclosed herein are embodiments of a circuit structure and, particularly, a thermal stabilization circuit for an optical ring resonator. The thermal stabilization circuit can include a heater, which is adjacent and thermally coupled to a closed-curve waveguide of the optical ring resonator. The thermal stabilization circuit can further include analog feedback circuit. The analog feedback circuit can include a fully autonomous analog feedback loop from a drop port of a bus waveguide of the optical ring resonator to the heater. This analog feedback circuit can be configured to dynamically control the power provided to the heater and, thereby to dynamically control the thermal output of the heater in order to tune the ring resonance wavelength to the operating laser wavelength. In the disclosed embodiments, the analog feedback circuit can specifically be configured so as to be independent of input power, so as to be power efficient, so as to have a relatively small footprint, so as to have a tunable time constant and, finally, so as to facilitate adjustable wavelength locking. Also disclosed herein are embodiments of a device (e.g., a ring-based transceiver or the like), which can include multiple optical ring resonators and corresponding thermal stabilization circuits, as described above.

Figure 1:
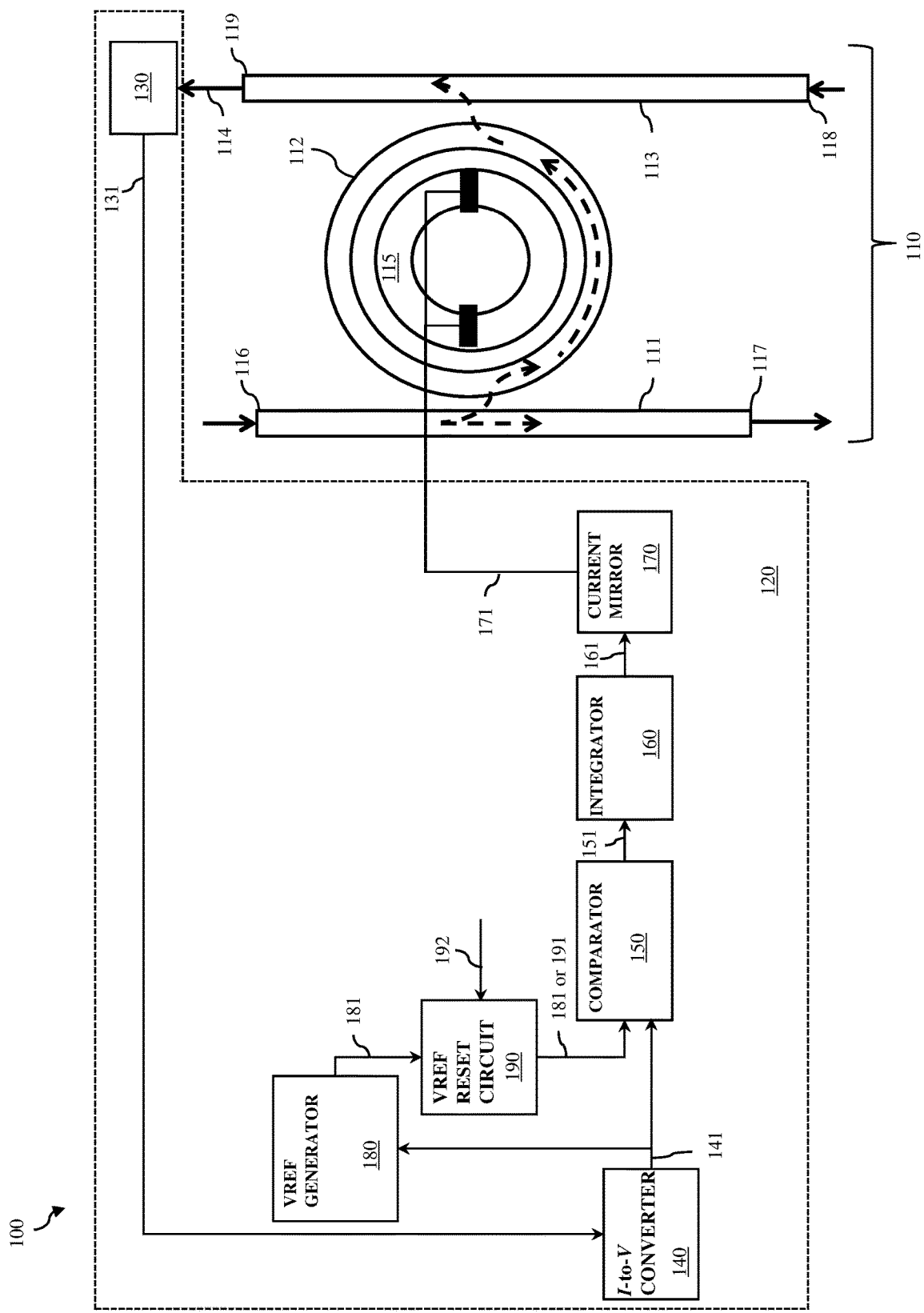
FIG. 1 is a schematic diagram illustrating disclosed embodiments of a thermal stabilization circuit including a heater and an analog feedback circuit.

More particularly, FIG. 1 is a schematic diagram illustrating disclosed embodiments of a circuit structure and, particularly, a thermal stabilization circuit 100 for an optical ring resonator 110.

The optical ring resonator 110 can be, for example, an add-drop micro-ring resonator configured for multiplexing and/or demultiplexing of wavelengths. Specifically, the optical ring resonator 110 can include multiple optical waveguides. These waveguides can have silicon cores, silicon nitride cores, or cores of any other suitable waveguide core material. The ring waveguides built of silicon core are especially sensitive for temperature change (effective index of depends on the temperature). In any case, the optical waveguides of the optical ring resonator 110 can include a first bus waveguide 111 (i.e., an optical waveguide with discrete ends) including an input port 116 at one end and a through port 117 at the opposite end. The optical ring resonator 110 can further include a second bus waveguide 113 (i.e., another optical waveguide with discrete ends) including an optional add port 118 at one end and a drop port 119 at the opposite end. The optical ring resonator 110 can further include a closed-curve waveguide 112 (i.e., an optical waveguide with a complete loop or ring shape having no discrete ends), which is spatially separated from but optically coupled to the first and second bus waveguides 111 and 113.

Figure 2A:
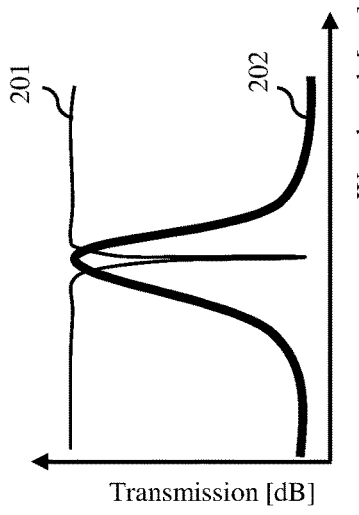
FIG. 2A is a graph illustrating an optical ring resonator through port and drop port transmission-to-wavelength characterization curves.

In the optical ring resonator 110, an optical signal received at the input port 116 of the first bus waveguide 111 can include light beams of one, two, or more wavelengths (e.g., $\lambda 1$, $\lambda 2$, etc.) and light beams of one of those wavelengths (e.g., $\lambda 1$ only) can interact with the ring resonator (i.e., light beams of all other wavelengths are irrelevant). When the ring resonance wavelength coincide with operating laser wavelength (e.g. $\lambda 1$ only)—ring operates at the resonance—can be separated out such that light beams of all wavelengths except $\lambda 1$ exit through the through port 117 and so that light beams of predominately $\lambda 1$ exit out the drop port 119 (as illustrated in the graph of FIG. 2A including curves 201 and 202 representing transmission power (dB) to wavelength ($\lambda$) at the through port 117 and the drop port 119, respectively). More specifically, the optical ring resonator 110 can be configured so that the drop port functions as an alternative output for light beams confined within the closed-curve waveguide 112 (i.e., for light beams having the specific resonance wavelength of the closed-curve waveguide 112). In other words, of all the light beams received at the input port 116 and passing from the first bus waveguide 111 into the closed-curve waveguide 112, those light beams that have the specific resonant wavelength for that closed-curve waveguide 112 will make repeated roundtrips through the closed-curve waveguide 112, building up intensity, due, for example, to constructive interference. Thus, the light beams that have the specific resonant wavelength and that pass from the closed-curve waveguide 112 into the second bus waveguide 113 and, thereby out the drop port 119 will, predominantly, have that specific resonant wavelength. Ideally, the specific resonant wavelength of the closed-curve waveguide 112 would remain constant at some desired wavelength (e.g., $\lambda 1$) such that the light beams at the drop port 119 are predominately light beams with $\lambda 1$.

The specific resonant wavelength of a closed-curve waveguide 112 can be thermally sensitive. That is, it can exhibit temperature-dependent resonance shifts (TDRS) so that, depending upon the temperature of the closed-curve waveguide 112, light beams at the drop port 119 may predominantly have a wavelength that is either somewhat longer or somewhat shorter than $\lambda 1$. For example, if the closed-curve waveguide 112 has a silicon core, then the potential TDRS can be, for example, approximately 70 picometers per Kelvin (pm/K) so that the peak wavelength at the drop port is $\lambda 1+/-$ depending upon the direction of the shift. For purposes of this disclosure, the peak wavelength refers to the wavelength of those light beams that are within the optical signal at the drop port 119 and that have the highest transmission power (dB) (i.e., the wavelength at the peak of the curve 202 in FIG. 2A).

Figure 2C:
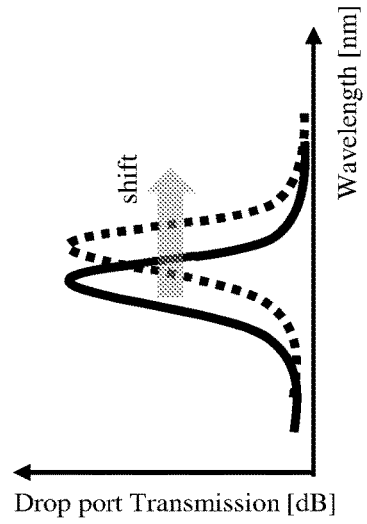
FIGS. 2B and 2C are graphs illustrating temperature dependence of the drop port transmission-to-wavelength characterization curve.
Figure 2B:
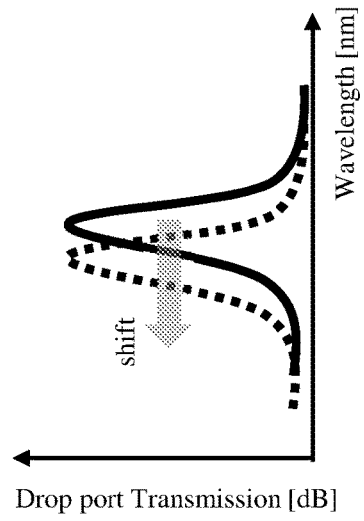

Therefore, disclosed herein are embodiments of a thermal stabilization circuit 100 that is configured to compensate for TDRS up or down. That is, in the event of TDRS that increases the resonant wavelength of the closed-curve waveguide 112, the thermal stabilization circuit 100 can cause the thermal output of the heater 115 to decrease, thereby decreasing the temperature of the closed-curve waveguide 112 such that the resonant wavelength of the closed-curve waveguide 112 decreases causing the peak wavelength of the optical signal at the drop port 119 to shift downward (e.g., down to $\lambda 1$) (as illustrated in FIG. 2B). Contrarily, in the event of TDRS that decreases the resonant wavelength of the closed-curve waveguide 112, the thermal stabilization circuit 100 can cause the thermal output of the heater 115 to increase, thereby increasing the temperature of the closed-curve waveguide 112 such that the resonant wavelength of the closed-curve waveguide 112 increases causing the peak wavelength of the optical signal at the drop port 119 to shift upward (e.g., up to $\lambda 1$) (as illustrated in FIG. 2C). In the event that no TDRS occurs, the thermal output of the heater 115 will remain unchanged.

The thermal stabilization circuit 100 can include a heater 115 (also referred to herein as a heating element). The heater 115 can be adjacent and thermally coupled to the closed-curve waveguide 112 for thermal tuning. Such a "heater" or "heating element" can be a resistor made of any suitable conductive material through which electric current can flow and be converted into heat energy. Those skilled in the art will recognize that the thermal output of the heater and, particularly, the amount of heat generated per unit length will depend upon the level of power provided to the heater (e.g., which can create a voltage differential across the heating element to cause the electric current to flow and which can be increased or decreased to increase or decrease, respectively, the thermal output of the heater), upon the material used, and on the current density (which is a function of the cross-sectional area of the heating element). Various different heater configurations for use with optical ring resonators and known in the art and could be incorporated into the thermal stabilization circuit 100. In any case, the heater 115 can be adjacent (e.g., above, below, encircled by or otherwise adjacent to) and thermally coupled to the closed-curve waveguide 112, as discussed above, so that heat energy from the heater 115 can pass to and adjust (up or down) the temperature of the closed-curve waveguide 112 in order to thermally tune the ring resonant wavelength of the closed-curve waveguide 112 (i.e., in order to achieve the desired resonant wavelength).

The thermal stabilization circuit 100 can further include an analog feedback circuit 120, which is electrically connected to the heater 115. Generally, this analog feedback circuit 120 can be configured to detect the optical signal at the drop port 119, to generate a reference voltage (Vref) signal using the optical signal (and, particularly, based on the detected peak wavelength of the optical signal) and to control the level of the power provided to the heater 115 based on the optical signal and on the Vref signal. When the power delivered to the heater decreases, the thermal output of the heater 115 decreases, thereby decreasing the temperature of the closed-curve waveguide 112 such that the resonant wavelength of the closed-curve waveguide 112 decreases causing the peak wavelength of the optical signal at the drop port 119 to shift downward (e.g., down to $\lambda 1$) (as illustrated in FIG. 2B). When the power delivered to the heater increases, the thermal output of the heater 115 increases, thereby increasing the temperature of the closed-curve waveguide 112 such that the resonant wavelength of the closed-curve waveguide 112 increases causing the peak wavelength of the optical signal at the drop port 119 to shift upward (e.g., up to $\lambda 1$) (as illustrated in FIG. 2C).

The analog feedback circuit 120 can include a photosensor 130. The photosensor 130 can be optically coupled to the drop port 119 of the second bus waveguide 113 of the optical ring resonator 110. The photosensor 130 can receive (e.g., can be configured to receive, can be adapted to receive, etc.) the optical signal 114 (light beams) from the drop port 119. The photosensor 130 can convert (e.g., can be configured to convert, can be adapted to convert, etc.) light energy of the optical signal 114 into an electrical signal and, particularly, an analog current signal 131. Those skilled in the art will recognize that the electrical conductance of such a photosensor will vary depending upon the intensity of the radiation receive including based on the peak wavelength of the optical signal. The photosensor 130 can be, for example, a photodiode (e.g., a germanium photodiode or some other suitable type of photodiode). Alternatively, the photosensor 130 can be any other suitable type of photosensor (e.g., a bipolar phototransistor, a photosensitive field effect transistor, etc.).

The analog feedback circuit 120 can further include various additional components including, but not limited to, a current-to-voltage (I-to-V) converter 140, a peak-based reference voltage (Vref) generator 180, a Vref initialization and reset device 190, a comparator 150, an integrator 160, and a current mirror 170, as discussed in greater detail below. FIGS. 3A-3B, 4, 5, 6, 7 and 8 are schematic diagrams illustrating exemplary configurations for these components 140, 180, 190, 150, 160 and 170, respectively.

Figure 3A:
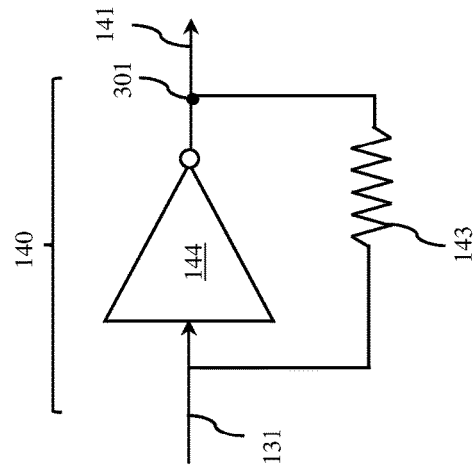
FIGS. 3A and 3B are schematic diagrams illustrating different I-to-V converters and, particularly, different transimpedance amplifiers (TIAs) that can be incorporated into the analog feedback circuit.
Figure 3B:
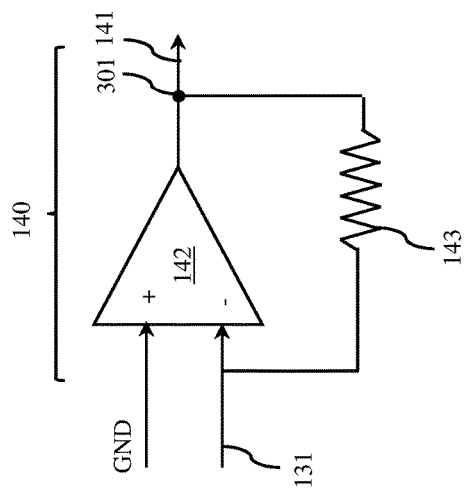

The I-to-V converter 140 can receive (e.g., can be configured to receive, can be adapted to receive, etc.) the analog current signal 131 from the photosensor 130, which is typically at a low level, and can convert (e.g., can be configured to convert, can be adapted to convert, etc.) that analog current signal 131 to an analog voltage signal 141. FIGS. 3A and 3B are schematic diagrams illustrating two different exemplary I-to-V converters 140 that could be incorporated into the analog feedback circuit 120. Specifically, as illustrated in FIG. 3A, the I-to-V converter 140 can be a transimpedance amplifier (TIA) circuit implemented with an operational amplifier 142 and a feedback resistor 143. The operational amplifier 142 can have an inverting input (−) connected to the photosensor 130 for receiving a low-level analog current signal 131, can have a non-inverting input (+) connected to ground, and can have an output node 301 for outputting the analog voltage signal 141. The output node 301 can further be connected by a feedback resistor 143 back to the inverting input (−), which sets the gain of the operational amplifier 142. Alternatively, any other suitable I-to-V converter could be incorporated into the analog feedback circuit 120 (e.g., such as the TIA shown in FIG. 3B that employs an inverter 144 in place of the operational amplifier shown in FIG. 3A). In any case, the analog voltage signal 141 output by the I-to-V converter 140 can be received by both the peak-based reference voltage (Vref) generator 180 and the comparator 150, as discussed below.

Figure 4:
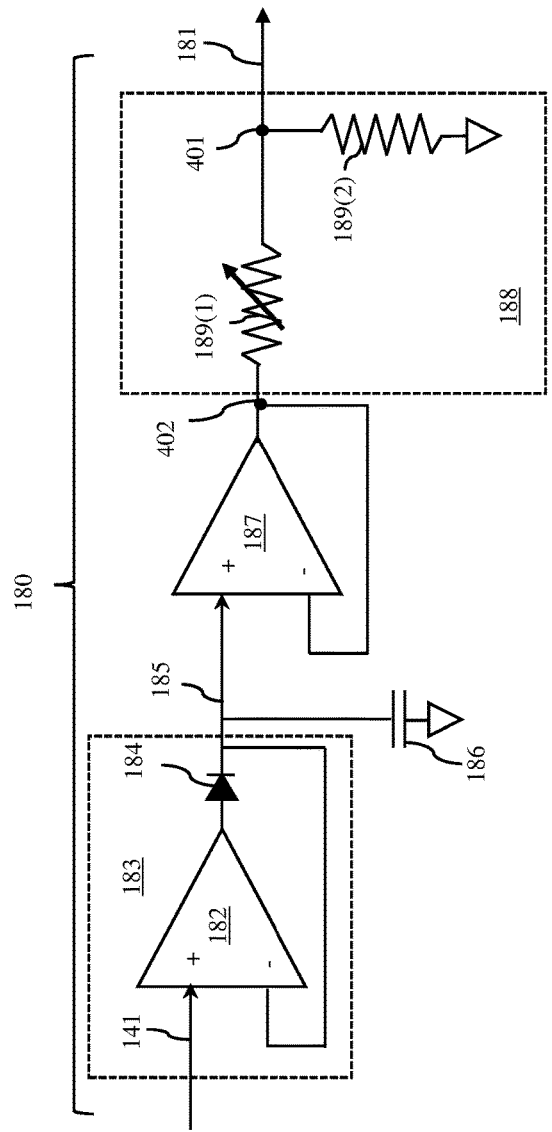
FIG. 4 is a schematic diagram illustrating an exemplary peak-based reference voltage generator that can be incorporated into the analog feedback circuit.

The peak-based reference voltage generator 180 can receive (e.g., can be configured to receive, can be adapted to receive, etc.) the analog voltage signal 141 and can generate (e.g., can be configured to generate, can be adapted to generate, etc.) a reference voltage (Vref) signal 181 based the analog voltage signal 141 and on an offset amount from a drop port transmission peak, as discussed below. FIG. 4 is a schematic diagram illustrating an exemplary peak-based reference voltage generator 180 that can be incorporated into the analog feedback circuit 120. Specifically, as illustrated in FIG. 4, the peak-based reference voltage generator 180 can include a diode 184 having a diode input and a diode output. The peak-based reference voltage generator 180 can further include a first amplifier 182 and a second amplifier 187. The first amplifier 182 can include two first amplifier inputs (i.e., a first inverting input (−) and a first non-inverting input (+)) and a first amplifier output. The first amplifier output is connected to the diode input, the first non-inverting input is connected to the I-to-V converter 140 for receiving the analog voltage signal 141, and the first inverting input is connected to the diode output. The second amplifier 187 includes two second amplifier inputs (i.e., a second inverting input (−) and a second non-inverting input (+)) and a second amplifier output 402. The second non-inverting input is connected to the diode output and the second inverting input is connect to the second amplifier output. The peak-based reference voltage generator 180 can further include a capacitor 186 having conductive plates connected to an intermediate node 185, which is between the diode 184 and the second amplifier 187, and to ground, respectively. The peak-based reference voltage generator 180 can further include an output node 401. A voltage divider 188 can be connected to the second amplifier output 402 and the output node 401 and can be configured to output the Vref signal 181 at the output node 401. The voltage divider 188 can include a pair of resistors 189(1)-189(2). These resistors can include a programmable resistor (also referred to herein as a variable resistor) 189(1) connected in series between the second amplifier output 402 and the output node 401 and an additional resistor 189(2) connected between the output node 401 and ground.

Figure 9:
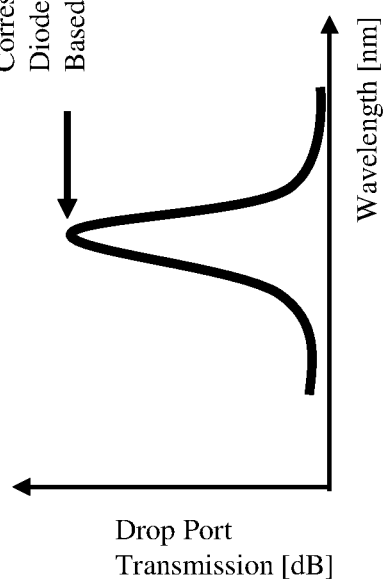
FIGS. 9 and 10 are drop port transmission-to-wavelength characterization curves illustrating the use of a reference voltage offset amount for optical modulation amplitude (OMA) optimization.
Figure 10:
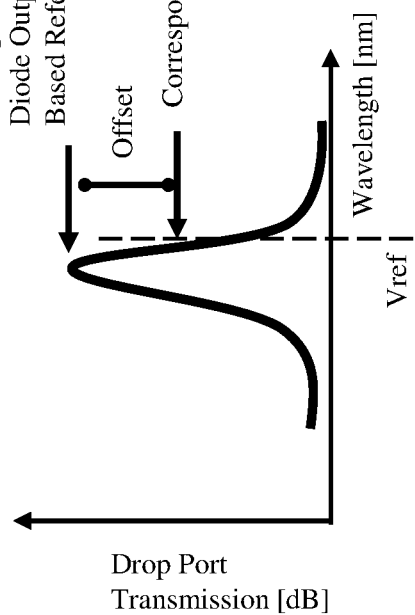

Within this peak-based reference voltage generator 180, the connections between the first amplifier 182 and the diode 184 effectively create what is known in the art as a super diode 183. In this super diode, when the analog voltage signal 141 at the first non-inverting input (+) is higher than the diode output voltage at the first inverting input (−), then the first amplifier output will be positive and the diode 184 will be conductive; whereas when the analog voltage signal 141 at the first non-inverting input (−) is lower than the diode output voltage at the first inverting input (−), then the first amplifier output will be negative and then the diode 184 will be non-conductive. When the diode 184 is conductive, the maximum voltage level of the diode output voltage is effectively tracked and stored in the capacitor 186 and is indicative of the drop port transmission peak (i.e., of the peak transmission power of the optical signal at the drop port 119, as illustrated in FIG. 9). In the second amplifier 187, when the diode output at the second non-inverting input (+) is higher than the second amplifier output at the second inverting input (−), then the second amplifier output will be positive; whereas when the diode output at the second non-inverting input (+) is lower than the second amplifier output at the second inverting input (−), then the second amplifier output will be negative. Thus, the second amplifier 187 prevents leakage (i.e., discharge of the capacitor). The voltage divider 188 is programmed to set the Vref signal 181 at the output node 401 at a predetermined fraction of the maximum voltage level (stored in the capacitor 186) given a desired offset amount from the drop port transmission peak. This offset amount and, thus, the resulting Vref signal 181 are selected to optimize the optical modulation amplitude (OMA) of the optical ring resonator 110 (e.g., as shown in FIG. 10). Alternatively, any other suitable peak-based Vref generator could be incorporated into the analog feedback circuit 120.

Figure 5:
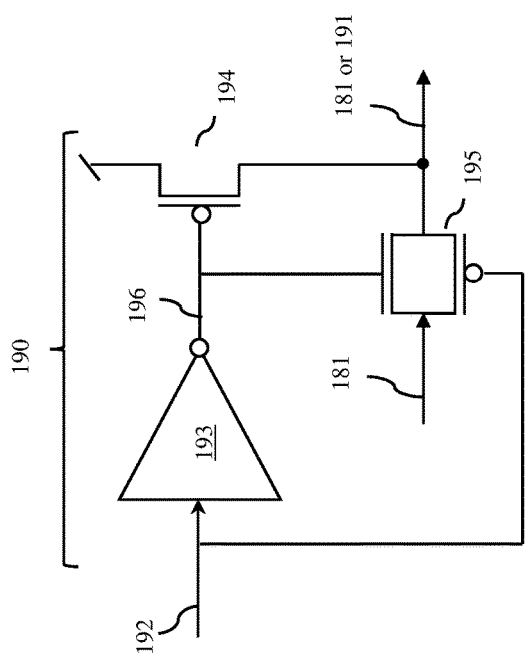
FIG. 5 is a schematic diagram illustrating an exemplary Vref initialization and reset device that can be incorporated into the analog feedback circuit.

It should be noted that establishment of the offset is discussed in greater detail below with regard to the Vref initialization and reset device 190 (e.g., as shown in FIG. 5).

Figure 6:
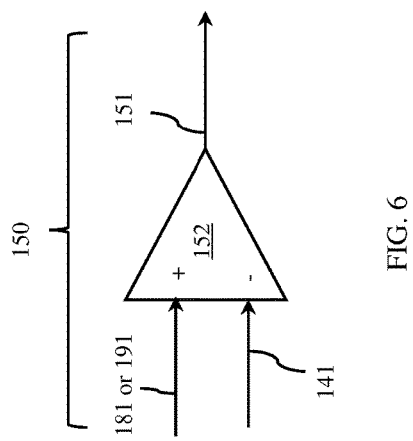
FIG. 6 is a schematic diagram illustrating an exemplary comparator that can be incorporated into the analog feedback circuit.

The comparator 150 can receive (e.g., can be configured to receive, can be adapted to receive, etc.) a pair of inputs specifically during an operational mode (as opposed to during a reset mode, as discussed in discussed in greater detail below with regard to the Vref initialization and reset device 190). The inputs can include the analog voltage signal 141 from the I-to-V converter 140 and the Vref signal 181 from the peak-based reference voltage generator 180, via the Vref initialization and reset device 190. The comparator 150 can further output (e.g., can be configured to output, can be adapted to output, etc.) a voltage control signal 151 given the two inputs. FIG. 6 is a schematic diagram illustrating an exemplary comparator 150 that can be incorporated into the analog feedback circuit 120. As illustrated, the comparator 150 can be an operational amplifier 152 with a non-inverting input (+) for receiving the Vref signal 181, an inverting input (−) for receiving the analog voltage signal 141, and an output for outputting the voltage control signal 151. In this comparator 150, when the Vref signal 181 at the non-inverting input (+) is higher than the analog voltage signal 141 at the inverting input (−) (indicating that the wavelength of the optical signal at the drop port 119 needs to be shifted upward), then the voltage control signal 151 will be positive. When the Vref signal 181 at the non-inverting input (+) is lower than the analog voltage signal 141 at the inverting input (−) (indicating that the wavelength of the optical signal at the drop port 119 needs to be shifted downward), then the voltage control signal 151 will be negative. When the Vref signal 181 at the non-inverting input (+) is the same as the analog voltage signal 141 at the inverting input (−) (indicating that the wavelength of the optical signal at the drop port 119 is at the desired position), then the voltage control signal 151 will be 0. Alternatively, any other suitable comparator could be incorporated into the analog feedback circuit 120. In any case, the voltage control signal 151 output by the comparator 150 can be received by the integrator 160.

Figure 7:
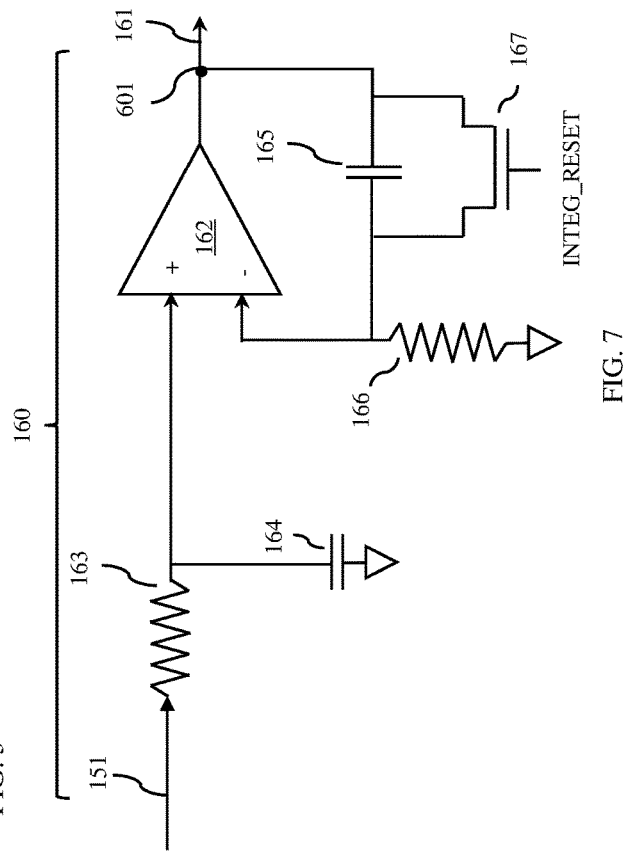
FIG. 7 is a schematic diagram illustrating an exemplary integrator that can be incorporated into the analog feedback circuit.

The integrator 160 can receive (e.g., can be configured to receive, can be adapted to receive, etc.) the voltage control signal 151 from the comparator 150. Additionally, the integrator 160 can output (e.g., can be configured to output, can be adapted to output etc.) an adjusted voltage signal 161, which is proportional to a time integral of the voltage control signal 151. FIG. 7 is a schematic diagram illustrating an exemplary integrator 160 that can be incorporated into the analog feedback circuit 120. As illustrated, the integrator 160 can be implemented using another operational amplifier 162 with a non-inverting input (+), an inverting input (−) and an output. The integrator 160 can further include a pair of resistors 163 and 166, which are connected to the non-inverting input (+) and inverting input (−) of the operational amplifier 162, respectively. The voltage control signal 151 can be applied to the non-inverting input (+) via the resistor 163. The resistor 166 can be connected between the inverting input (−) of the operational amplifier 162 and ground. The integrator 160 can further include a pair of capacitors 164 and 165. The capacitor 164 can be connected between the non-inverting input (+) of the operational amplifier 162 and ground. The capacitor 165 can be connected between an output node 601 and the inverting input (−) of the operational amplifier 162. Optionally, the integrator 160 can further include an integrator reset transistor 167 connected in parallel with the capacitor 165.

With the above-described integrator configuration, when the voltage control signal 151 from the comparator 150 is positive (indicating that the wavelength of the optical signal at the drop port 119 needs to be shifted upward), the voltage level of the adjusted voltage signal 161 output from the integrator 160 will increase; whereas when the voltage control signal 151 from the comparator 150 is negative (indicating that the wavelength of the optical signal at the drop port 119 needs to be shifted downward), the voltage level of the adjusted voltage signal 161 output from the integrator 160 will decrease. Alternatively, any other suitable integrator could be incorporated into the analog feedback circuit 120.

It should be noted that the rate of the change to the adjusted voltage signal 161 output from the integrator 160 will vary depending upon how positive or how negative the voltage control signal 151 is. For example, when the voltage control signal 151 from the comparator 150 has a high positive value (indicating that the wavelength of the optical signal at the drop port 119 needs to be shifted upward by a large amount), the voltage level of the adjusted voltage signal 161 output from the integrator 160 can increase relatively fast; whereas, when the voltage control signal 151 from the comparator 150 has a low positive value (indicating that the wavelength of the optical signal at the drop port 119 needs to be shifted upward by a small amount), the voltage level of the adjusted voltage signal 161 output from the integrator 160 can increase relatively slowly. Similarly, when the voltage control signal 151 from the comparator 150 has a high negative value (indicating that the wavelength of the optical signal at the drop port 119 needs to be shifted downward by a large amount), the voltage level of the adjusted voltage signal 161 output from the integrator 160 can decrease relatively fast; whereas, when the voltage control signal 151 from the comparator 150 has a low negative value (indicating that the wavelength of the optical signal at the drop port 119 needs to be shifted downward by a small amount), the voltage level of the adjusted voltage signal 161 output from the integrator 160 can decrease relatively slowly. The varying rate of change of the adjusted voltage signal 161 in response to changes in the voltage control signal 151 is referred to as the time constant for the integrator 160. It should be understood that the voltage control signal is considered "positive" or "negative" relative to a common ground in the system (i.e., it is positive if it is higher than the common ground or negative if it is lower than the common ground) or, alternatively, relative to some arbitrarily selected voltage.

The current mirror 170 can receive (e.g., can be configured to receive, can be adapted to receive, etc.) the adjusted voltage signal 161 from the comparator 150 and, in response to the adjusted voltage signal 161, can control (e.g., can be configured to control, can be adapted to control, etc.) the level of power (i.e., electrical power) provided to the heater 115 by adjusting the output current 171 (Iout) that flows to the heater 115. Specifically, as the adjusted voltage signal 161 changes, the output current 171 that flows to the heater 115 and, thereby the level of the power provided to the heater 115 dynamically changes (increases or decreases). Furthermore, as the output current 171 from the current mirror 170 changes (and thereby the level of power provided to the heater 115 changes), the thermal output of the heater 115 also changes (e.g., due to corresponding changes in the voltage differential across the heating element) in order to control thermal tuning of the optical ring resonator 110. For example, as discussed above, when the output current 171 that flows to the heater 115 decreases (and, thus, the level of power provided to the heater 115 decreases), the thermal output of the heater 115 decreases, thereby decreasing the temperature of the closed-curve waveguide 112 such that the resonant wavelength of the closed-curve waveguide 112 decreases causing the peak wavelength of the optical signal at the drop port 119 to shift downward (e.g., down to λ1) (as illustrated in FIG. 2B). Conversely, when the output current 171 that flows to the heater 115 increases (and, thus, the level of power provided to the heater 115 increases), the thermal output of the heater 115 increases, thereby increasing the temperature of the closed-curve waveguide 112 such that the resonant wavelength of the closed-curve waveguide 112 increases causing the peak wavelength of the optical signal at the drop port 119 to shift upward (e.g., up to λ1) (as illustrated in FIG. 2C).

Figure 8:
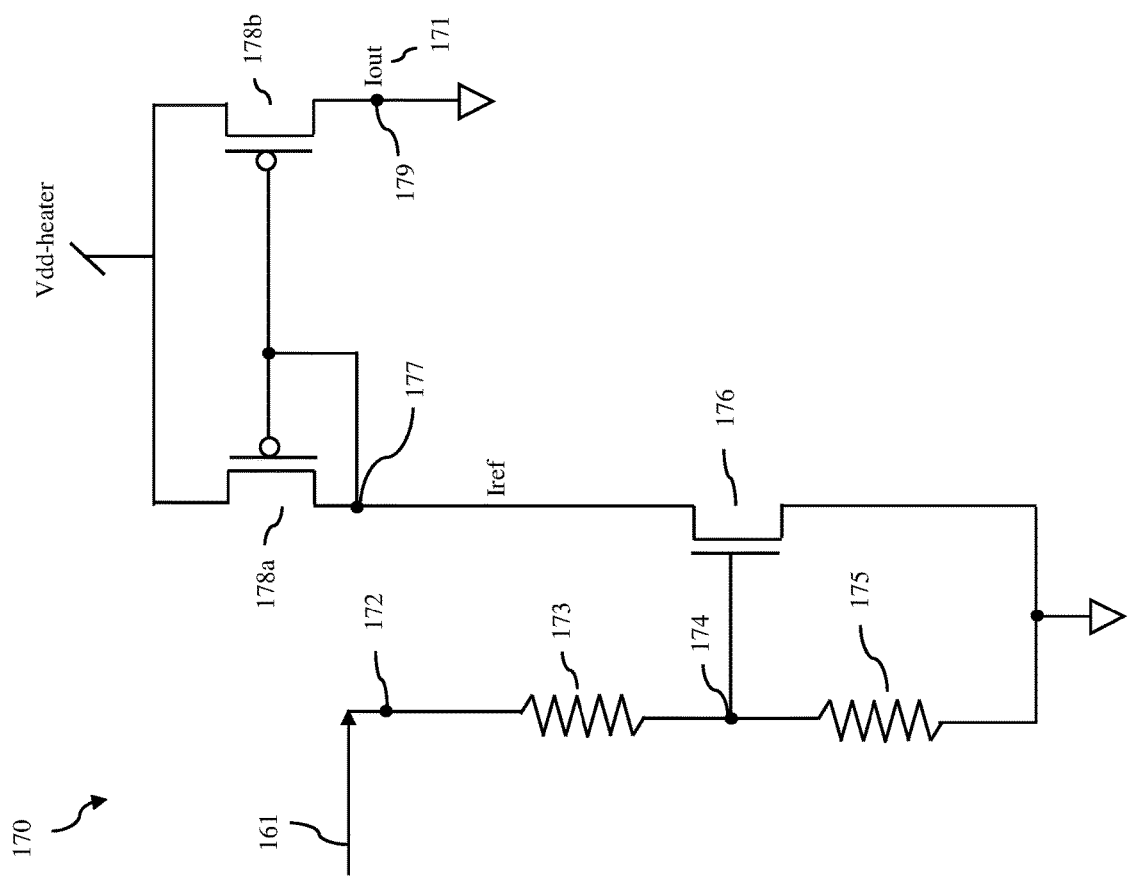
FIG. 8 is a schematic diagram illustrating an exemplary current mirror that can be incorporated into the analog feedback circuit.

FIG. 8 is a schematic diagram illustrating an exemplary current mirror 170 that can be incorporated into the analog feedback circuit 120. This current mirror 170 can include two resistors 173 and 175, an n-type field effect transistor (NFETs) 176 to set a reference current flow, and two p-type field effect transistor (PFET) 178a and 178b for current mirroring that depends on the PFETs' area ratio. Specifically, the resistors 173 and 175 can be connected in series between a current mirror input node and ground. The NFET 176 can be connected in series between a current mirror node 177 and ground and can further have a gate connected to an intermediate node 174 at the junction between the resistor 173 and the resistor 175. The PFETs 178a-178b can be connected in parallel with their respective source regions connected to a positive voltage supply rail, with the drain region of the PFET 178a connected to the current mirror node 177, with the drain of the PFET 178b connected to a current output node 179, and with their respective gates connected to the current mirror node 177, as illustrated. The heater 115 can be connected to the current output node 179 for receiving the output current (Iout) 171. In operation, the current mirror 170 of FIG. 8 can receive the adjusted voltage signal 161 at the input node 172 and can output Iout 171 at the current output node 179. If the voltage level of the adjusted voltage signal 161 increases, the voltage level at the intermediate node 174 connected to the gate of the NFET 176 increases, thereby increasing the conductivity of the NFET 176 and increasing current flow through the NFET 176 (i.e., increasing Iref). This results in the voltage level at the current mirror node 177 decreasing, thereby increasing the conductivity of the PFETs 178a-178b and causing a corresponding increase in Iout 171. Conversely, if the voltage level of the adjusted voltage signal 161 decreases, the voltage level at the intermediate node 174 connected to the gate of the NFET 176 decreases, thereby decreasing the conductivity of the NFET 176 and decreasing current flow through the NFET 176 (i.e., decreasing Iref). This results in the voltage level at the current mirror node 177 increasing, thereby decreasing the conductivity of the PFETs 178a-178b and causing a corresponding decrease in Iout 171. It should be understood that the exemplary current mirror circuit shown in FIG. 8 is provided for illustration purposes. Alternatively, any other suitable current mirror could be incorporated into the analog feedback circuit 120.

It should be noted that, although the thermal output of the heater 115 will change as a function of changes in the level of power provided to the heater 115 (due to changes in the output current 171, as discussed above), those skilled in the art will recognize that the change in the thermal output will not be instantaneous. Instead the rate of change in the thermal output of a heater in response to changes in power will depend upon the heating element materials, dimensions, etc. Furthermore, the rate of the change to the thermal output will vary depending upon how on the level of change required. For example, if a large change in the thermal output of the heater is required, the rate of change of the thermal output can be relatively quick; whereas, if only a small change in thermal output is required, the rate of change of the thermal output can be relatively slow. The varying rate of change of the thermal output of the heater 115 in response to changes in the output current 171 is referred to as the time constant for the heater 115. Therefore, to ensure the output current 171 does not change at a rate that is too fast for the heater 115 to properly respond, the heater 115 and the integrator 160 can be designed so that they have approximately equal time constants. That is, they can be designed so that the rate of the change to the adjusted voltage signal 161 output from the integrator 160 in response to changes in the voltage control signal 151 corresponds to the rate of change of the thermal output of the heater 115 in response to changes in the output current 171.

As mentioned above, the analog feedback circuit 120 can also include a Vref initialization and reset device 190. The Vref initialization and reset device 190 can be connected between the peak-based Vref generator 180 and the comparator 150. This device 190 can operation (e.g., can be configured to operate, can be adapted to operate, etc.) in either an operational mode or an initialization/reset mode in response to a mode control signal 192 (e.g., from a controller (not shown). The device 190 can pass (e.g., can be configured to pass, can be adapted to pass, etc.) the Vref signal 181 from the Vref generator 180 through to the comparator 150, when operating in the operational mode. The device 190 can pass (e.g., can be configured to pass, can be adapted to pass, etc.) a relatively high positive supply voltage signal 191 (e.g., Vdd) to the comparator 150 (instead of the Vref signal 181), when operating in the initialization/reset mode. FIG. 5 is a schematic diagram illustrating an exemplary Vref initialization and reset device 190 that can be incorporated into the analog feedback circuit 120. As illustrated, the device 190 can include an inverter 193, a transmission gate 195, and a power supply transistor 194. The inverter 193 can receive a mode control signal 192 (e.g., from a controller (not shown) and can output an inverted mode control signal 196. The transmission gate 195 can include a PFET and an NFET connected in parallel between an input node and an output node. The gate of the PFET can be controlled by the mode control signal 192 and the gate of the NFET can be controlled by the inverted mode control signal 196. The power supply transistor 194 can be an additional PFET, which is connected in series between a positive supply voltage rail and the output node. In operation, when the mode control signal is low (indicating the operational mode), the inverted mode control signal 196 will be high such that the PFET and NFET of the transmission gate are both on and the power supply transistor 194 is off. In this case, the Vref signal 181 received at the input node will pass through to the output node and thereby to the comparator 150. However, when the mode control signal is high (indicating the initialization/reset mode), the inverted mode control signal 196 will be low such that the PFET and NFET of the transmission gate are both off and the power supply transistor 194 is on. In this case, the Vref signal 181 received at the input node will be prevented from passing through to the output node (and comparator 150) and instead the output node is connected to the positive supply voltage rail such that a relatively high positive supply voltage signal 191 passes to the comparator 150.

In the operational mode, the thermal stabilization circuit 100 performs dynamic thermal tuning, as discussed above. Specifically, as described above, the thermal stabilization circuit 100 monitors the optical signal at the drop port 119 to detect any change in peak wavelength (corresponding to a TDRS) and, in response to a detected change in the peak wavelength, adjusts the thermal output of the heater 115 in order to adjust the temperature of the closed-curve waveguide 112 of the optical ring resonator 110 and, thereby shift the peak wavelength back up or down as needed (e.g., as illustrated in FIGS. 2B and 2C discussed above).

In the initialization/reset mode, the full range of power to the heater 115 is swept in order to determine the optimal operating position. Specifically, in the initialization/reset mode at circuit initialization, the comparator 150 can receive a relatively high positive supply voltage 191 at the non-inverting input (+) and the analog voltage signal 141 at the inverting input (−). In this case, the high positive supply voltage 191 will always be greater than the analog voltage signal 141, such that the voltage control signal 151 output from the comparator 150 is positive in this mode. Thus, the integrator 160 will increase the level of the adjusted voltage signal 161, which is proportional to a time integral of the voltage control signal 151 and the current mirror 170 will increase the output current 171 (Iout) at the current mirror output node 179 and, thus, increase the level of power delivered to the heater 115, thereby increasing the thermal output of the heater 115 from the minimum heating level to the maximum heating level. During this reset mode (i.e., during the sweep of the heater 115 from the minimum heating level to the maximum heating level), the optical signal at the drop port 119 is sampled in order to determine the optimal operating position and, more particularly, in order to determine the optimal offset to use for generating the Vref signal 181. As discussed above, the peak-based Vref generator 180 (e.g., as shown in FIG. 4) generates a Vref signal 181 by storing in capacitor 186 charges corresponding to ring drop-port optical power converted to voltage by a photosensor 130 followed by I-V converter 140. While sweeping heater power at least one ring resonance is expected to be found (ring heater design should allow that). Tunable resistor ratio will define a fixed voltage offset from the maximum (corresponding exactly resonance wavelength) detected 185. The offset can depend on intrinsic ring parameters such as Q-factor or operating voltage and it's needed to maximize optical modulation amplitude that is defined as linear difference in the optical between transmitted bit "1" and bit "0". In any case, once the optimal offset is determined the voltage divider 188 and, particularly, the programmable resistor 189(1) can be programmed accordingly depending on the type of modulator and peak-to-peak driving voltage. Alternatively, any other suitable Vref initialization and reset device could be employed to determine the optimal operating position.

It should be noted that upon switching to the operational mode from the initialization/reset mode (i.e., when the mode control signal 192 switches from high to low), the thermal stabilization circuit 100 adynamic thermal tuning, as discussed above. Specifically, as described above, the Vref signal 181 (which is less than the positive supply voltage) will be provided as an input to comparator 150. At the end of the initialization/reset mode, the optical signal 114 at the drop port 119 will have been generated when the heater 115 was set at the maximum heating level (i.e., at maximum thermal output) and, thus, will have a peak wavelength that in all likelihood needs to be shifted downward by a significant amount to achieve the desired peak wavelength (e.g., $\lambda 1$). That is, at the comparator 150 (e.g., see FIG. 6 and the discussion above), the Vref signal 181 will be less than the analog voltage signal 141 such that the voltage control signal 151 is negative. Then, at the integrator 160 (e.g., see FIG. 7 and the discussion above), a voltage control signal 151 that is negative (indicating that the wavelength of the optical signal 114 at the drop port 119 needs to be shifted downward) results in a decreasing adjusted voltage signal 161 (and, particularly, an adjusted voltage signal proportional to a time integral of the voltage control signal). At the current mirror 170 (e.g., see FIG. 8 and the discussion above), the decreasing adjusted voltage signal 161 results in a decrease in the output current 171 at the current mirror output node 179 and, thus, a decrease in the level of power being supplied to the heater 115 in order to effectively cool the closed-curve waveguide 112 of the optical ring resonator and, thereby shift the peak wavelength at the drop port 119 downward (shorten wavelength).

The above-described analog feedback circuit 120 is specifically configured so as to be independent of input power, so as to be power efficient, so as to have a relatively small footprint, so as to have a tunable time constant and, finally, so as to facilitate adjustable wavelength locking.

Figure 11:
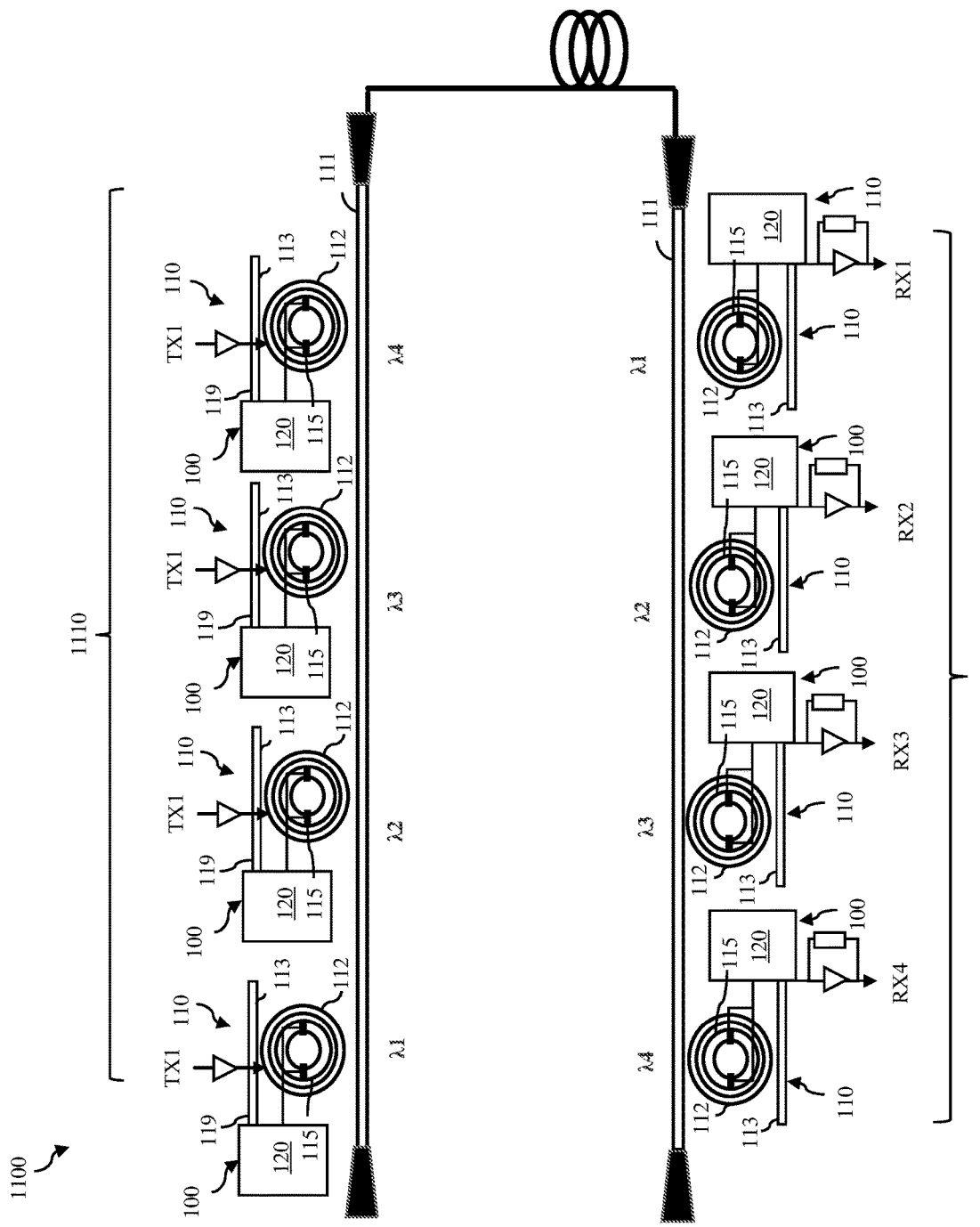
FIG. 11 is a schematic diagram illustrating a device that includes multiple optical ring resonators with thermal stabilization circuits.

Referring to FIG. 11, also disclosed herein are embodiments of a device 1100 that includes multiple optical ring resonators 110. Each optical ring resonator 110 in the device 1100 can be configured essentially the same as the optical ring resonator in the above-described structures. That is, each optical ring resonator 110 in the device 1100 can include a closed-curve waveguide 112 positioned laterally between a first bus waveguide 111 and a second bus waveguide 113. Optionally, in some embodiments, two or more of the optical ring resonators 110 in the device 1100 can share a common bus waveguide. That is, two or more of the optical ring resonators 110 can have a closed-curved waveguide 112 that is positioned laterally between a corresponding portion of a shared first bus waveguide 111 and a discrete second bus waveguide 113.

The device 1100 can further include thermal stabilization circuits 100, also as described above, for at least some of the optical ring resonators 110. Each thermal stabilization circuit 100 for a given one of the optical ring resonators 110 can include a heater 115 adjacent to the closed-curve waveguide 112 of that optical ring resonator 110. Additionally, each thermal stabilization circuit 100 for a given one of the optical ring resonators 110 can include an analog feedback circuit 120, which can detect an optical signal 114 at a drop port 119 of that optical ring resonator 110, which can generate a reference voltage (Vref) signal 181 using the optical signal 114, and which can control power provided to the heater 115 based on the optical signal 114 and on the Vref signal 181 in the same manner as described in detail above with regard to FIG. 1. It should be noted that such a device 1100 could be any optoelectronic device that includes multiple optical ring resonators.

For example, the device 1100 could be a ring-based transceiver, as illustrated in FIG. 11. The ring-based transceiver can, for example, be a wavelength-division multiplexing (WDM) optical transceiver. This transceiver can include a transmitter section 1110 and a receiver section 1120. The transmitter section 1110 can include, for example, a ring modulator bank with multiple optical ring resonators 110. Each optical ring resonator 110 in the bank in the transmitter section 1110 can have a different resonant wavelength (e.g., $\lambda 1$-$\lambda 4$) and can be connected to a corresponding thermal stabilization circuit 100 (including a heater 115 and analog feedback circuit 120, as described above) configured to maintain that resonant wavelength. The receiver section 1120 can include, for example, a ring filter bank with multiple optical ring resonators 110. Each optical ring resonator 110 in the bank in the receiver section 1120 can have a different resonant wavelength (e.g., $\lambda 1$-$\lambda 4$) and can be connected to a corresponding thermal stabilization circuit 100 (including a heater 115 and analog feedback circuit 120). It should be understood that the thermal stabilizations circuits 100 in the transmitter section 1110 and the receiver section 1120 would be very similarly designed but specifically configured to maintain the resonant wavelengths of the respective sections. Alternatively, the device could be any other type of device that includes multiple optical ring resonators requiring thermal stabilization (e.g., a ring-based transmitter, a ring-based receiver, etc.).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a heater adjacent to an optical ring resonator; and
    an analog feedback circuit configured to detect an optical signal at a drop port of the optical ring resonator, to generate an analog voltage signal using the optical signal, to generate a reference voltage signal using the analog voltage signal, to compare the reference voltage signal to the analog voltage signal to generate a voltage control signal, and to control power provided to a heater based on the voltage control signal.

2. The structure of claim 1, wherein the optical ring resonator comprises:
    a first bus waveguide having an input port and a through port;
    a second bus waveguide having the drop port; and
    a closed-curve waveguide between the first bus waveguide and the second bus waveguide, wherein the heater is adjacent to the closed-curve waveguide and wherein the power controls a thermal output of the heater so as to tune a ring resonance wavelength.

3. The structure of claim 1, wherein the analog feedback circuit comprises:
    a photosensor configured to receive the optical signal from the drop port and to output an analog current signal;
    a current-to-voltage converter configured to receive the analog current signal and to output the analog voltage signal; and
    a peak-based reference voltage generator configured to receive the analog voltage signal and to generate the reference voltage signal based the analog voltage signal.

4. The structure of claim 3, wherein the peak-based reference voltage generator further generates the reference voltage signal based on an offset amount from a drop port transmission peak.

5. The structure of claim 4, wherein the peak-based reference voltage generator comprises:
   a diode having a diode input and a diode output;
   a first amplifier comprising: two first amplifier inputs and a first amplifier output, wherein the first amplifier output is connected to the diode input and wherein the two first amplifier inputs are connected to the current-to-voltage converter for receiving the analog voltage signal and to the diode output, respectively;
   a second amplifier comprising two second amplifier inputs and a second amplifier output, wherein the two second amplifier inputs are connected to the diode output and to the second amplifier output, respectively;
   a capacitor connected to an intermediate node between the diode and the second amplifier and to ground and configured to store a maximum voltage level corresponding to the drop port transmission peak;
   an output node; and
   a voltage divider connected to the second amplifier output and the output node, wherein the voltage divider is configured to output the reference voltage signal at the output node such that the reference voltage signal is a predetermined fraction of the maximum voltage level given the offset amount.

6. The structure of claim 5, wherein the voltage divider comprises:
   a programmable resistor connected in series between the second amplifier output and the output node; and
   an additional resistor connected between the output node and ground.

7. The structure of claim 3, wherein the analog feedback circuit further comprises:
   a comparator configured to receive the analog voltage signal and the reference voltage signal and to output the voltage control signal;
   an integrator configured to receive the voltage control signal and to output an adjusted voltage signal proportional to a time integral of the voltage control signal; and
   a current mirror configured to receive the adjusted voltage signal and to control the power provided to the heater.

8. The structure of claim 7, wherein the heater and the integrator have approximately equal time constants.

9. The structure of claim 7, wherein the analog feedback circuit further comprises: a reset device connected between the peak-based reference voltage generator and the comparator, wherein the reset device is operable in one of an operational mode and a reset mode in response to a mode control signal, wherein in the operational mode the reset device passes the reference voltage signal to the comparator, and wherein in the reset mode the reset device passes a positive supply voltage signal to the comparator.

10. A structure comprising:
   optical ring resonators; and
   thermal stabilization circuits for the optical ring resonators, wherein each thermal stabilization circuit for each optical ring resonator comprises:
      a heater adjacent to the optical ring resonator; and
      an analog feedback circuit configured to detect an optical signal at a drop port of the optical ring resonator, to generate an analog voltage signal using the optical signal, to generate a reference voltage signal using the analog voltage signal, to compare the reference voltage signal to the analog voltage signal to generate a voltage control signal, and to control power provided to the heater based on the voltage control signal.

11. The structure of claim 10,
wherein each optical ring resonator comprises:
   a portion of a first bus waveguide, wherein the first bus waveguide has an input port and a through port;
   a second bus waveguide having the drop port; and
   a closed-curve waveguide between the first bus waveguide and the second bus waveguide,
wherein the heater of the thermal stabilization circuit for each optical ring resonator is adjacent to the closed-curve waveguide of the optical ring resonator, and
wherein the power provided to the heater controls a thermal output of the heater so as to tune a resonance wavelength.

12. The structure of claim 10, wherein the analog feedback circuit of the thermal stabilization circuit for each optical ring resonator comprises:
   a photosensor configured to receive the optical signal from the drop port and to output an analog current signal;
   a current-to-voltage converter configured to receive the analog current signal and to output the analog voltage signal;
   a peak-based reference voltage generator configured to receive the analog voltage signal and to generate the reference voltage signal based the analog voltage signal and on an offset amount from a drop port transmission peak;
   a comparator configured to receive the analog voltage signal and the reference voltage signal and to output the voltage control signal;
   an integrator configured to receive the voltage control signal and to output an adjusted voltage signal proportional to a time integral of the voltage control signal, wherein the heater and the integrator have approximately equal time constants; and
   a current mirror configured to receive the adjusted voltage signal and to output the current output signal to the heater.

13. The structure of claim 12,
wherein the peak-based reference voltage generator of the corresponding analog feedback circuit comprises:
   a diode having a diode input and a diode output;
   a first amplifier comprising: two first amplifier inputs and a first amplifier output, wherein the first amplifier output is connected to the diode input and wherein the two first amplifier inputs are connected to the current-to-voltage converter for receiving the analog voltage signal and to the diode output, respectively;
   a second amplifier comprising two second amplifier inputs and a second amplifier output, wherein the two second amplifier inputs are connected to the diode output and to the second amplifier output, respectively;
   a capacitor connected to an intermediate node between the diode and the second amplifier and to ground and configured to store a maximum voltage level corresponding to the drop port transmission peak;
   an output node; and
   a voltage divider connected to the second amplifier output and the output node, wherein the voltage divider is configured to output the reference voltage signal at the output node such that the reference voltage signal is a predetermined fraction of the maximum voltage level given the offset amount, and
wherein the corresponding analog feedback circuit further comprises a reset device connected between the peak-based reference voltage generator and the comparator, wherein the reset device is operable in one of an operational mode and a reset mode in response to a mode control signal, wherein in the operational mode the reset device passes the reference voltage signal to the comparator, and wherein in the reset mode the reset device passes a positive supply voltage signal to the comparator.

* * * * *